Figure 1:
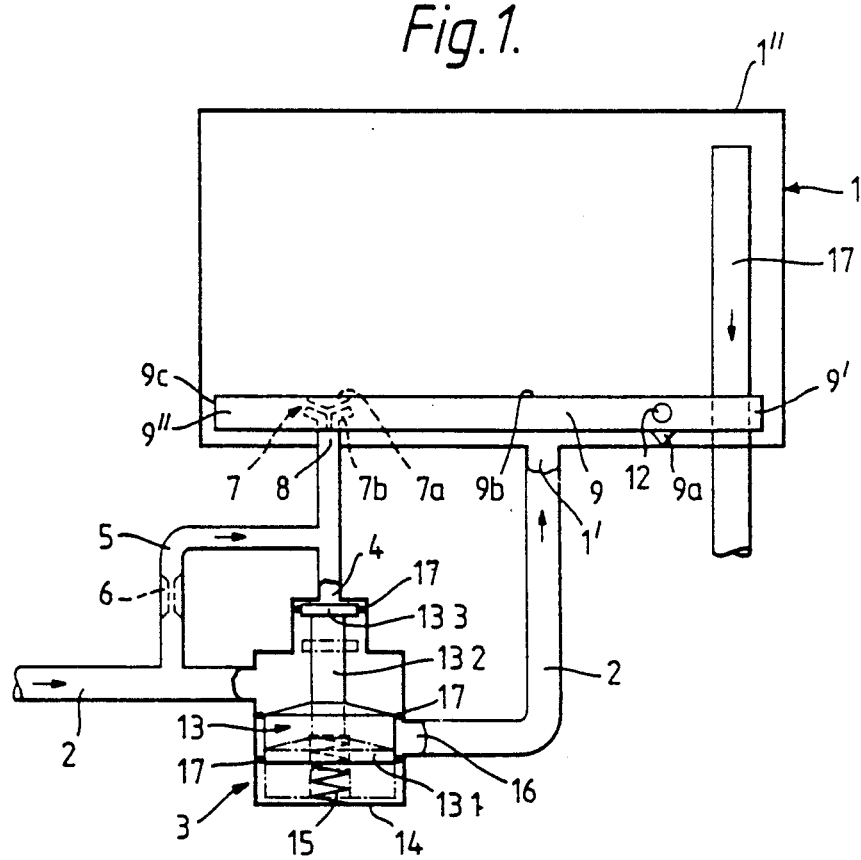

United States Patent [19]

Titterington et al.

[11] Patent Number: 5,000,207

[45] Date of Patent: Mar. 19, 1991

[54] APPARATUS SUITABLE FOR PROCESSING SEMICONDUCTOR SLICES

[75] Inventors: Joseph B. Titterington; William Ardern, both of Stockport, United Kingdom

[73] Assignee: U.S. Philips Corporation, New York, N.Y.

[21] Appl. No.: 127,861

[22] Filed: Dec. 2, 1987

[30] Foreign Application Priority Data

Dec. 19, 1986 [GB] United Kingdom ............... 8630403

[51] Int. Cl.$^5$ .............................................. B08B 3/04
[52] U.S. Cl. .................................. 134/44; 134/56 R; 134/147; 134/155; 251/156; 137/624.27
[58] Field of Search ............... 134/44, 56 R, 146, 147, 134/186, 156, 155, 52, 49; 118/694, 429, 304; 137/489, 624.27, 500; 251/156

[56] References Cited

U.S. PATENT DOCUMENTS

| | | | |
|---|---|---|---|
| 927,320 | 7/1909 | Blum | 134/44 |
| 2,370,775 | 3/1945 | Capita | 134/44 X |
| 3,095,463 | 6/1963 | Chang et al. | 134/57 R X |
| 3,151,628 | 10/1964 | Heckert | 137/500 |
| 3,427,198 | 2/1969 | Hill | 134/57 R X |
| 3,662,997 | 5/1972 | Bloom | 134/147 |
| 4,435,151 | 3/1984 | Matumoto et al. | 137/500 |
| 4,554,936 | 11/1985 | Tingley | 134/146 |

FOREIGN PATENT DOCUMENTS 2424482 12/1974 Fed. Rep. of Germany ........ 134/52

Primary Examiner—Frankie L. Stinson
Attorney, Agent, or Firm—Paul R. Miller

[57] ABSTRACT

Apparatus suitable for processing semiconductor slices, comprises a tank (1) for receiving a jig carrying semiconductor slices, a first supply line (2) for supplying a processing liquid to the tank (1), a supply valve (3) for controlling liquid supply through the first supply line (2), the supply valve (3) being operable in response to changes in fluid pressure at a control port (4) of the supply valve (3) and a second supply line (5) for supplying fluid to the control port (4) to control operation of the supply valve (3). The second supply line (5) communicates with an inlet (8) of the tank (1) via a control valve (7) which is operable in response to changes within the tank to control the fluid pressure at the control port (4) and so control operation of the supply valve (3).

In the arrangement shown in FIG. 1, a valve member (7a) of the valve (7) is carried by a platform (9) pivotally mounted within the tank (1). The weight of a jig carrying semiconductor slices acting on the platform (9) causes the platform (9) to tilt to close the control valve (7) thereby increasing the fluid pressure at the control port (4), causing the supply valve to open and so supply liquid to the tank via the inlet (1').

22 Claims, 4 Drawing Sheets

APPARATUS SUITABLE FOR PROCESSING SEMICONDUCTOR SLICES

This invention relates to apparatus suitable for processing semiconductor slices and is particularly applicable to use in rinsing or washing semiconductor slices after treatment in an acid etchant bath.

Conventionally, a plastics material jig carrying semiconductor slices is placed, after treatment in an acid etchant bath, into a rinsing bath or tank to which demineralised water is continously supplied at a relatively high flow rate of, for example, 5 liters per minute for 3 inch (7.6 cm) slices or 7 liters per minute for 4 inch (10.2 cm) slices, waste water merely weiring over the top of the bath or tank. The jig is kept in the rinsing tank until the resistivity of the demineralised water within the tank reaches a desired value, for example 5 Megaohms, at which the slices are considered to be sufficiently clean of acid etchant. Such a rinsing process inevitably consumes large quantities of demineralised water. Also the rinsing time required per jig may be rather lengthy (up to thirty minutes), particularly if the plastics material of the jig has become contaminated in some way.

According to one aspect of the present invention, there is provided apparatus suitable for processing semiconductor slices, the apparatus comprising a tank for receiving a jig carrying semiconductor slices, a first supply line for supplying a processing liquid to the tank, a supply valve for controlling liquid supply through the first supply line, the supply valve being operable in response to changes in fluid pressure at a control port of the supply valve and a second supply line for supplying fluid to the control port to control operation of the supply valve, in which apparatus the second supply line communicates with an inlet of the tank via a control valve and the control valve is operable in response to changes within the tank to control the fluid pressure at the control port and so control operation of the supply valve.

Thus, as the supply of liquid to the tank is controlled by changes within the tank, the supply of liquid for processing may be more accurately controlled which may result in savings in the amount of processing liquid used.

In particular, the control valve may be arranged to operate to open the supply valve in response to a weight being placed within the tank.

In one arrangement, the tank may contain a platform for supporting an object such as a jig carrying semiconductor slices, the platform being mounted within the tank so as to be movable under the weight of a jig carrying semiconductor slices to operate the control valve to open the supply valve. Generally, the platform carries one of a valve member and a valve seat of the control valve and the other of the valve member and the valve seat of the control valve comprises the inlet of the tank which communicates with the second supply line. In such an arrangement, the supply of processing liquid via the first supply line is controlled by the placing of the object, for example a jig carrying semiconductor slices, to be processed in the tank, therefore enabling saving of processing liquid.

The apparatus may also comprise a further first supply line for supplying liquid to the tank, a further supply valve for controlling liquid flow through the further supply line and a further second supply line communicating with a further control valve and with a control port of the further supply valve, the further control valve being operable in response to changes in liquid level within the tank. In an alternative arrangement, the control valve may be operable in response to changes in liquid level within the tank. In either case, the or the further control valve may be operable by a float mounted to a movable member so as to enable the float to move with a liquid level in the tank when the liquid level exceeds a predetermined height above a bottom of the tank and the movable member may comprise a rod depending from the float and slidably mounted to a wall of the tank or a float chamber communicating with the tank, the rod having a lower end which cooperates with an outlet of the or the further second supply line to form the or the further control valve, the rod supporting the float at a predetermined height above a bottom of the tank so that the lower end of the rod engages the outlet of the second supply line to close the or the further control valve until liquid level in the tank rises sufficiently to cause the float to float and to lift the lower end of the rod out of engagement with the outlet of the or the further second supply line.

The provision of a float-controlled supply valve enables the tank to be filled quickly to a predetermined level prior to the introduction of the object to be processed.

Where a float controlled supply valve is provided, means may be provided within the tank for maintaining the float in a raised position when a jig carrying slices is placed in the tank to prevent opening of the said further supply valve. Thus, for example, where a platform movable under the weight of an object to be processed is provided in the tank, the rod may be connected to the platform so that the float is maintained in a raised position when an object is placed on the platform. Such an arrangement is particularly desirable if it is desired to be able to drain the tank of liquid with the object being processed still in the tank without causing the float controlled supply valve to open.

In order to provide such a draining facility, the or a supply valve may carry a closure member movable by operation of the supply valve between a first position, corresponding to one of the open and closed conditions of the supply valve, in which the closure member seals an outlet of the tank and a second position, corresponding to the other of the open and closed conditions if the supply valve, in which the closure member allows liquid to drain through the outlet. Alternatively, the apparatus may further comprise another supply valve for controlling liquid supply via the said other first supply line, the second supply line of the supply valve communicating with the control port of the said other supply valve to control the said other supply valve, the said other supply valve being controlled by the control valve so that when one of the and the said other supply valves is open the other is closed, the said other supply valve carrying a closure member movable by operation of the said other supply valve so that when the said other supply valve is closed the closure member closes an outlet of the tank and, when the said other supply valve is open, the closure member allows liquid to drain from the tank via the outlet. Generally, the or a first supply line communicates via the or the respective supply valve with one or more spray heads disposed for spraying liquid downwardly into the tank and a hydraulic accumulator may be provided to enable supply of liquid to the spray head(s) to be maintained for a period after the or the associated supply valve is closed. Such an arrangement is particularly advantageous where the control valve controlling the supply valve communicating with the spray heads also controls the supply valve which is associated with the tank closure member as it enables an object to be processed, for example a jig carrying semiconductor slices from which acid etchant is to be removed, to be plunged into a tank filled with demineralised water (for example filled via by a float-controlled supply valve) to effect some cleansing of the semiconductor and then, automatically in response to the object being placed on the platform, simultaneously allows the soiled water to drain away and sprays the object(s) with fresh demineralised water to effect further cleansing.

Usually, the or each second supply line communicates with the or the respective first supply line via a flow restricting device so that when the or the respective control valve is open a relatively low volume flow of liquid passes into the tank. Normally, the or each supply valve comprises a movable piston which in one of the open and closed conditions of the supply valve seals the control port and which is movable against biassing means to the other of the open and closed conditions of the supply valve in response to an increase in the fluid pressure at the control port caused by closing of the or the associated control valve. The or each control valve may comprise a needle valve.

According to another aspect of the present invention, there is provided apparatus for processing semiconductor slices, the apparatus comprising a tank for receiving a jig carrying semiconductor slices to be processed, a supply line for supplying a processing liquid to the tank, a supply valve for controlling liquid supply through the supply line and a platform for supporting a jig carrying semiconductor slices, the platform being mounted within the tank so as to be movable under the weight of a jig carrying semiconductor slices to open or close the supply valve. The apparatus may further comprise a further supply line for supplying liquid to the tank and a further supply valve for controlling liquid flow through the further supply line, the further supply valve being operable in response to changes in liquid level within the tank and the further supply valve may be controlled by a float carried by a rod slidably mounted to a wall of the tank or a float chamber communicating with the tank, the rod supporting the float at a predetermined height above the bottom of the tank and having a lower end cooperating with a movable member of the further supply valve so as to maintain the further supply valve in an open condition until a liquid level in the tank exceeds the predetermined level and the float rises to lift the lower end of the rod out of engagement with the movable member so as to allow the further supply valve to close. Also, an expansible member may be arranged to maintain a closure member in a first position closing an outlet of the tank and expansion and contraction of the expansible member may be controlled by operation of the said supply valve so that opening of the said supply valve causes the expansible member to collapse allowing liquid to drain from the tank and closure of the said supply valve causes the expansible member to expand to seal the tank outlet.

Again, the apparatus enables the supply of processing liquid, for example demineralised water for rinsing objects such as semiconductor slices to be controlled by the weight of the object to be processed being place in the tank so that processing liquid need not be wasted unduly. Similar, the apparatus also allows the tank to be drained by operation of the said supply valve which may at the same time allow processing liquid to be supplied to the spray heads to further process the object(s) while soiled or used processing liquid drains away.

It should of course be appreciated that the apparatus described above may be used in any combination, in particular a system for processing semiconductor slices may comprise a plurality of processing tanks each for use in carrying out a particular processing step, at least one of the tanks forming part of apparatus in accordance with the one or the other aspect of the invention.

For example such a system may comprise one or more first tanks for initial rinsing or quenching of a jig carrying semiconductor slices, a second tank for receiving a jig from the first tank(s), the second tank containing a platform movable under the weight of a jig carrying semiconductor slices to cause a supply valve to open to supply liquid to spray heads disposed above the second tank and at the same time to cause a tank closure member to move to open a drain outlet to allow used processing liquid to drain from the second tank and a third tank for receiving a jig from the second tank, the third tank containing a platform movable under the weight of a jig to cause a supply valve to open to supply processing liquid to the third tank. Filling of the first, second and third tanks may be via a float-controlled supply valve as described above and each tank may be associated with its own float controlled supply valve. Alternatively or additionally the float controlled supply valve(s) may be provided in a float chamber communicating with the second tank so that the float controlled valves are all activated when the second tank is drained. Further, waste liquid from the second and third tanks may be supplied to the first tanks. In an alternative system, the second tank closure door may be operated manually, for example by a plunger, and supply of liquid to the spray heads may be controlled by a float controlled supply valve in the float chamber communicating with the second tank.

Figure 2:
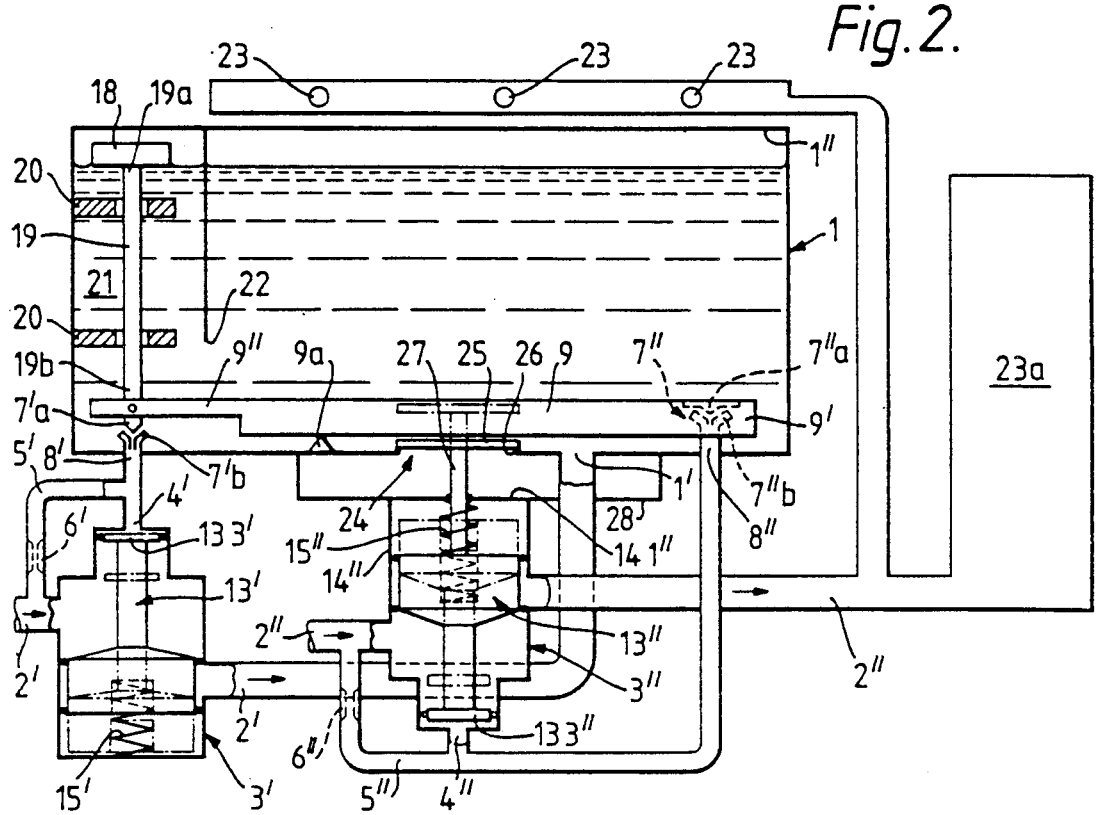
Figure 3:
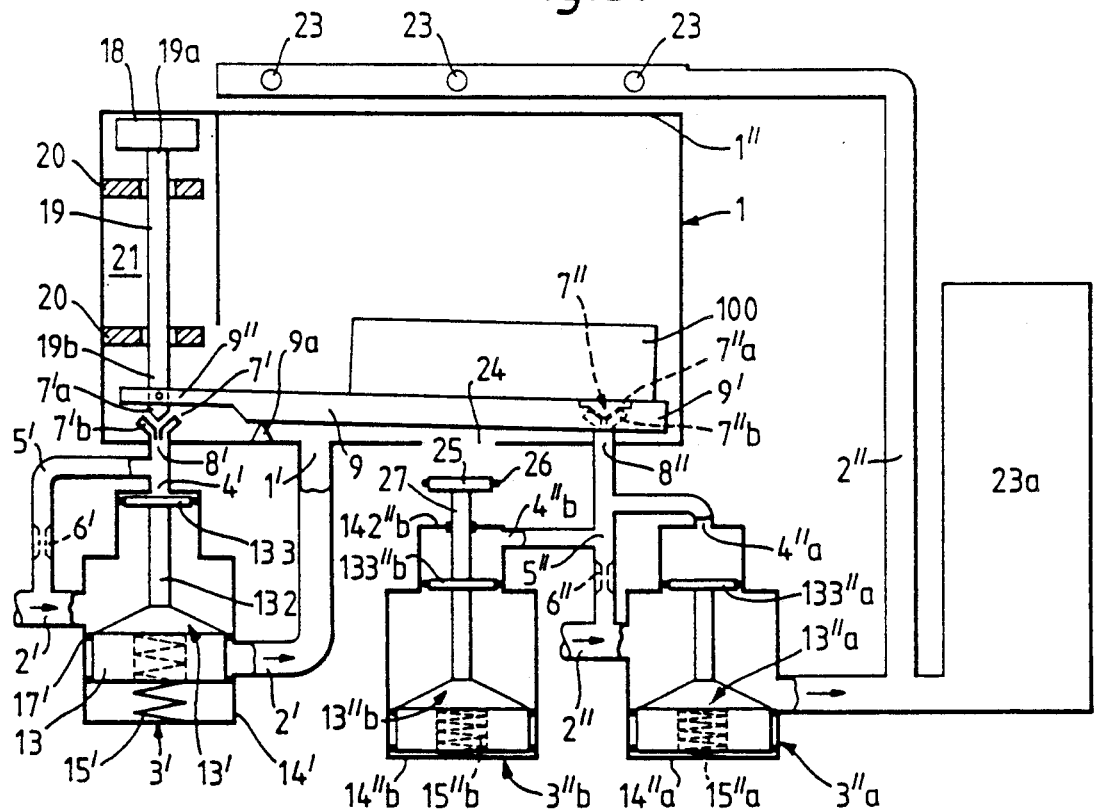
Figure 4:
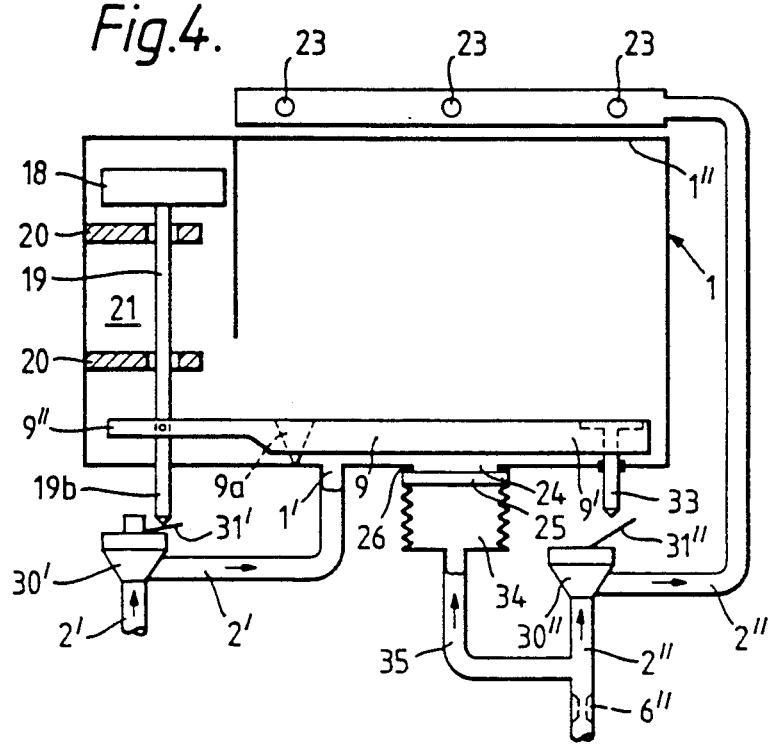
Figure 5:
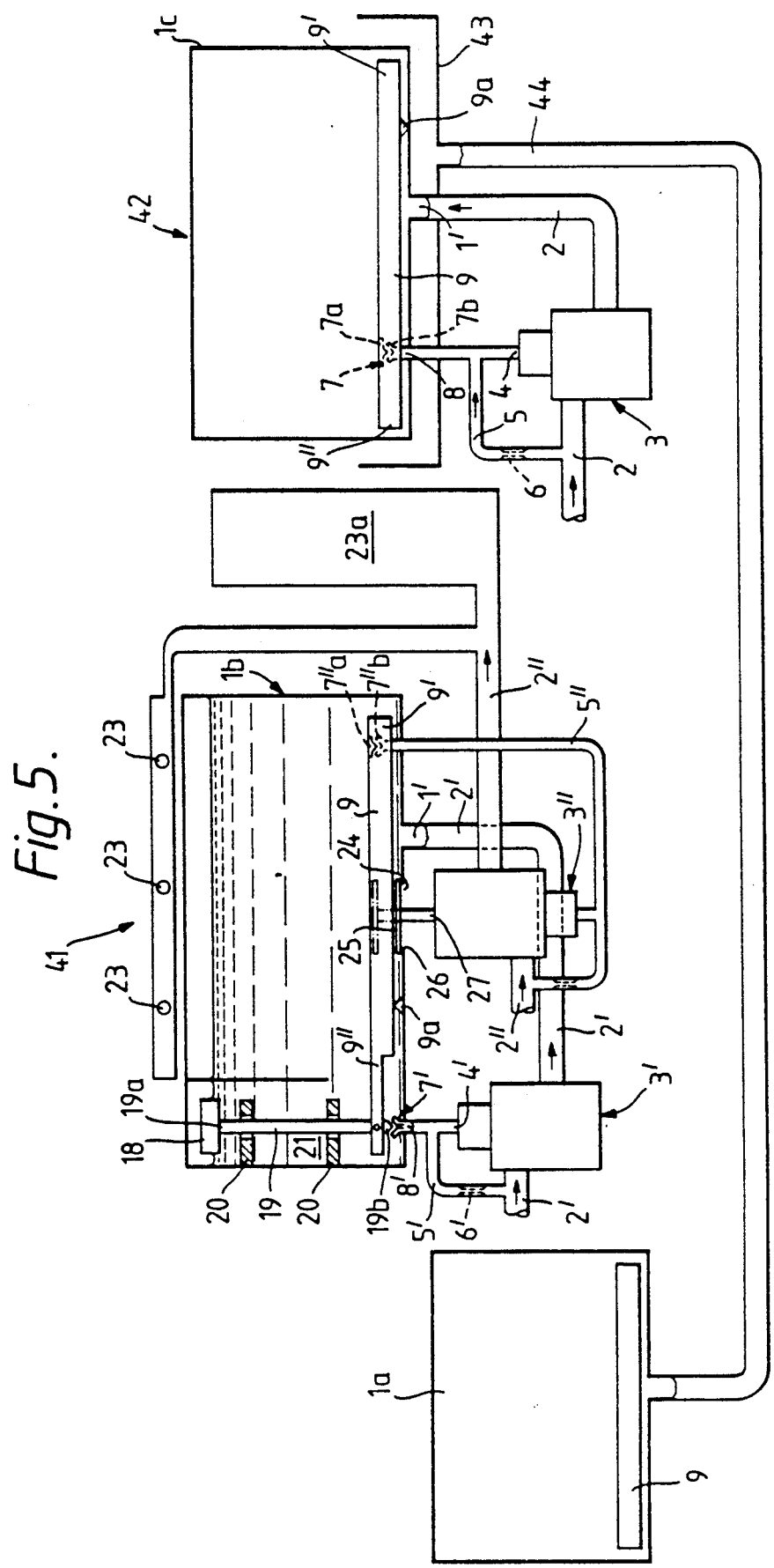
Figure 6:
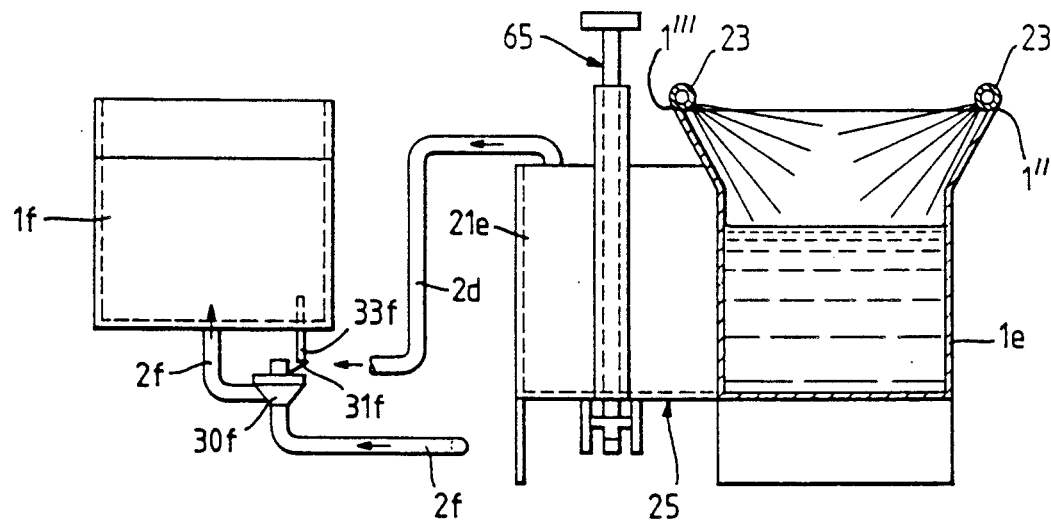
Figure 7:
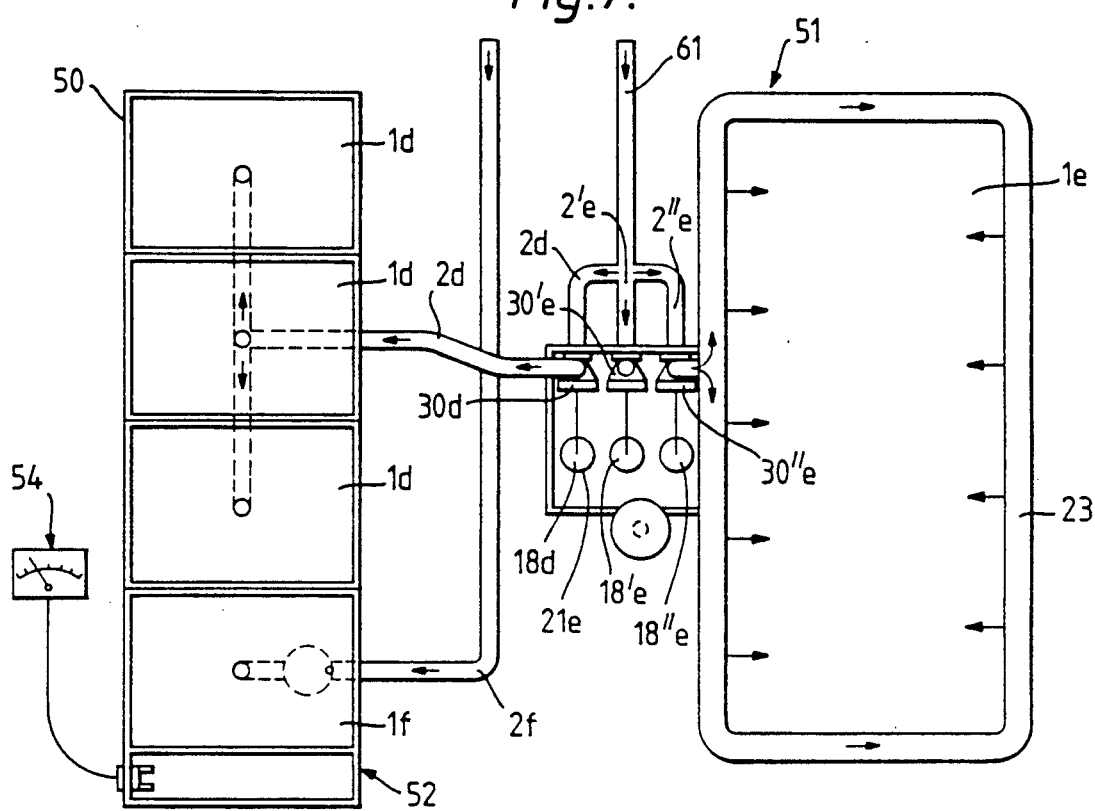

In order that the invention may be more readily understood, embodiments thereof will now be described, by way of example, with reference to the accompanying drawings, in which:

FIG. 1 is a schematic cross-sectional view of a first embodiment of apparatus in accordance with the invention, FIG. 2 is a schematic cross-sectional view of a second embodiment of apparatus in accordance with the invention, FIG. 3 is a schematic cross-sectional view of a modified version of the apparatus shown in FIG. 2, FIG. 4 is a schematic cross-sectional view of a further embodiment of apparatus in accordance with the invention, FIG. 5 is a schematic cross-sectional view of a system for washing semiconductor slices including one or a series of tanks, one or more of which forms part of apparatus in accordance with the invention, and FIGS. 6 and 7 show, respectively, a schematic part cut-away side elevational and a top plan view of an alternative system for washing semiconductor slices including one or a series of tanks, one or more of which forms part of apparatus in accordance with the invention.

It should of course be appreciated that the drawings are diagrammatic and are not drawn to scale. Further-more the cross-sectional views have, in the interest of clarity, been shown without cross-hatching.

Referring now to the drawings, FIG. 1 illustrates schematically one embodiment of apparatus in accordance with the invention for, for example, washing semiconductor slices to remove residual etchant acid from the slices.

As shown in FIG. 1, the apparatus comprises a tank 1 for receiving a plastics material jig (not shown) carrying silicon slices to be washed or rinsed. Demineralised water for washing or rinsing the slices is supplied to the tank from a demineralised water supply (not shown) along a first supply line or pipe 2 to an inlet 1' in the bottom of the tank. A supply valve 3 is provided in the first supply pipe 2 to control the flow of demineralised water along the first supply pipe 2. The supply valve 3 is controllable by changes in fluid pressure at a control port 4 of the supply valve 3. The control port 4 of the supply valve 3 communicates with a second supply line or pipe 5. As shown the second supply line or pipe 5 branches off from the first supply pipe 2 and is connected to the first supply pipe 2 via a flow restricting device 6 so that a relatively low or trickle flow of demineralised water is supplied via the second supply pipe 5. Of course, the second supply pipe 5 need not necessarily be connected to the first supply pipe 3 but could be connected directly to a separate relatively low flow demineralised water supply or alternatively an air or other non reactive gas supply.

The second supply pipe 5 also communicates with an auxiliary inlet 8 in the bottom of the tank 1. A control valve 7 is provided at the auxiliary inlet 8 of the tank 1 for closing or opening the auxiliary inlet 8 to increase or decrease, respectively, fluid pressure at the control port 4 and so operate the supply valve 3.

The control valve 7 operates in response to changes within the tank 1, in particular in response to changes in weight within the tank 1. In the arrangement shown in FIG. 1, the control valve 7 is closed in response to the increase in weight caused by the placing of a jig carrying silicon slices within the tank 1.

In the arrangement shown in FIG. 1, a movable member in the form of a platform 9 for supporting a jig carrying silicon slices is provided within the tank 1. The platform 9, in the absence of any additional weight being applied to the platform, is balanced on a fulcrum or pivot 9a disposed closer to one of two opposite edges 9' of the platform than the other 9" so that when a jig carrying slices is placed on the platform 9 the center of gravity is moved away from the fulcrum or pivot 9a and the platform 9 tilts or rotates about the fulcrum 9 under the influence of the applied weight to close the control valve 7 and so increase the fluid pressure at the control part 4 to operate the first valve 3 as will be described in detail below. The fulcrum 9a may be replaced by a pivot rod 12 extending through the platform 9 along the axis about which the platform 9 tilts when a jig carrying semiconductor slices is placed on the platform. The pivot rod 12, if provided, is mounted to the side walls of the tank 1 and is rotatable about its axis with respect to either the platform or the side walls of the tank to enable pivoting of the platform.

In the arrangement shown in FIG. 1, the underneath of the platform 9 adjacent the other edge 9" of the platform carries a valve member 7a of the control valve 7 while the inlet 8 carries a cooperating valve seat 7b so that when the platform 9 is tilted by a weight being placed upon it the valve member 7a is brought into engagement with the valve seat 7b to close the control valve 7. The control valve 7 may, as shown, be a needle valve. It should of course be appreciated that the arrangement of the valve seat and valve member could be reversed. Other types of valves can of course be used and the valve member 7a may be separate from and merely be acted upon by the platform 9.

The supply valve 3 may be of any type where opening and closing of the valve can be controlled by fluid pressure at a control port of the valve. In the arrangement shown in FIG. 1, the supply valve 3 comprises a movable piston 13 which is disposed in a chamber 14 and is normally biassed by a spring 15 received in a recess at an enlarged head end 131 of the piston into a position (shown in solid lines in FIG. 1) closing an outlet 16 of the supply valve 3 and so preventing flow of liquid into the tank 1 via the supply valve 3. The enlarged head end 131 of the piston is connected by a relatively narrow neck 132 to a closure member 133 which normally closes the control port 4. O-ring 17 or similar seals are provided on the piston head 131 and the closure member 133 to provide liquid tight seals.

Closure of the control valve 7 by a weight such as a jig carrying semiconductor slices being placed on the platform 9 as described above causes an increase in fluid pressure at the control port 4 sufficient to overcome the biassing force of the spring 15 and to move the piston 13 against the biassing force to the open condition (shown in dotted lines in FIG. 1) to allow demineralised water from the supply to flow through the first supply line 2 and supply valve 3 into the tank 1 via the inlet 1' to fill the tank. The tank 1 may be provided with a constant head or overflow pipe 17 to provide a constant head of water, or surplus water may be allowed merely to weir over the top 1" of the tank 1.

In the case of the apparatus shown in FIG. 1, with the tank 1 previously filled with demineralised water, the platform 9 will be balanced on the fulcrum or pivot 9a and the control valve 7 will be open so that a trickle flow of demineralised water flows through into the tank via the second supply line 5 through the flow restricting device 6 and the open control valve 7 to keep the water in the tank fresh, excess water flowing out of the tank via the constant head pipe 17 or weiring over the top 1" of the tank. When a weight such as a jig carrying silicon slices to be rinsed or washed is placed on the platform 9, the platform 9 tilts or pivots about the fulcrum 9a bringing the valve member 7a and valve seat 7b into engagement to close the control valve 7 causing the fluid pressure at the control port 4 to increase so that the piston 13 is forced against the spring biassing to the open condition (shown in dotted lines in FIG. 1) allowing demineralised water to flow through the pipe 2 and into the tank via the inlet 1a. Thus, while the tank is not in use the demineralised water in the tank is kept fresh by the trickle flow through the control valve 7 and the higher flow required for rinsing or washing does not occur until the jig carrying the slices to be rinsed is actually placed on the platform 9.

FIG. 2 illustrates a second embodiment of apparatus in accordance with the invention.

As shown in FIG. 2, the apparatus uses two supply valves 3' and 3" of a type the same as or similar to the supply valve 3 shown in FIG. 1.

Each of the supply valves 3' and 3" is associated with its own first supply line 2' and 2" (although the two lines 2' and 2" may be connected to the same demineralised water supply) and its own second supply line 5' and 5"

as described above in relation to FIG. 1. Each of the second supply lines 5' and 5" communicates with the control port 4' and 4" of the associated supply valve 3' and 3" and with a respective inlet 8' and 8" of the tank via a respective control valve 7' and 7".

In the arrangement shown in FIG. 2, the supply valve 3' and the associated control valve 7' provide a fast fill facility for initial filling of the tank 1 with demineralised water via the inlet 1' while the supply valve 3" and associated control valve 7" provide simultaneously a draining and a spraying facility.

As in the arrangement shown in FIG. 1, the control valves 7' and 7" operate in response to changes in a weight applied to part of the control valve. In the case of the control valve 7', the weight consists of a float 18 mounted to one end 19a of a rod 19. The rod 19 extends vertically within the tank (i.e. perpendicular to the surface of any liquid within the tank) and is mounted to the side wall of the tank by brackets 20 so as to be slidable parallel to its length to enable the float 18 to move up and down with a liquid level in the tank 1. The other or lower end 19b of the rod 19 is shaped to form a valve member 7'a of the control valve 7' and is seated within a valve seat 7'b of the control valve 7' formed at the inlet 8' of the tank 1 when the tank is empty. The length of the rod 19 is selected so that the float 18 is positioned at a predetermined height above the bottom of the tank. Thus initially, assuming the tank is empty of water, the control valve 7' will be closed because of the influence of gravity on the float and rod combination. As in the arrangement described in relation to FIG. 1, the fluid pressure at the control port 4' caused by the closed control valve 7' causes the supply valve 3' to be open so allowing demineralised water to flow through the first supply pipe 2' and via the inlet 1' to fill the tank 1. As the liquid level within the tank 1 rises it will eventually reach the level of the float 18. Once the float 18 begins to float, the weight of the rod and float combination 18 and 19 is no longer applied to close the control valve 7' and the control valve 7' opens allowing a trickle flow of liquid via the second supply pipe 2' and inlet 8' into the tank. The reduction fluid pressure at the control port 4' caused by opening of the control valve 7' enables the first valve piston 13' to return, under the biassing force of the spring 15', to the closed condition preventing further fast filling of the tank 1. The trickle flow of demineralised water through the inlet 8' serves to keep the water within the tank fresh or sweet, excess water weiring over the top 1" of the tank 1 or flowing out through a constant head or overflow pipe (not shown). The float 18 and rod 19 combination may be disposed in a separate float chamber 21 which communicates with a main part of the tank via an opening 22.

The other supply valve 3" is controlled by a weight being placed on the platform 9 in a manner very similar to that of the supply valve 3 in the FIG. 1 arrangement except that the relative positions of the fulcrum 9a and the control valve 7" are reversed so that the fulcrum 9a is closer to the float chamber 21 or end 9" of the platform and the control valve 7" is adjacent the other end 9' of the platform.

The first supply line 2" in which the other supply valve 3" is disposed communicates with a series of spray heads 23 mounted above the tank as shown in FIG. 2 so as to enable demineralised water to be sprayed down into the tank. Two rows of spray heads 23 may be provided, one being disposed above or at one top edge 1" of the tank and the other being disposed above or at the opposite top edge 1''' of the tank (see FIG. 6). Each row may consist of, for example, three spray heads 23.

A hydraulic accumulator 23a is provided for storing demineralised water supplied via the first supply line 2" to provide a pressure head to enable demineralised water to be supplied to the spray heads 23 for a period after the supply valve 3" has been reclosed.

As indicated above the supply valves 3' and 3" may be of the same type as the supply valve 3 shown in FIG. 1. As can be seen from FIG. 2, the supply valve 3" is mounted to a bracket 28 carried by the bottom of the tank and is disposed upside down when compared with the supply valve 3' so that the control port 4" communicating with the inlet 8" and second supply line 2" is remote from the tank 1. As shown in FIG. 2, the bottom of the tank 1 has a main or drain outlet 24. The drain outlet 24 is closed by a tank closure member 25 carrying a suitable seal, for example an O-ring seal 26. The tank closure member 25 is connected via a connecting rod 27 through an aperture (appropriate seals are provided at the aperture) in an end face 141" of the chamber 14" of the supply valve 3" to the piston 13" so that the closure member 25 moves with the piston 13". Thus, when the control valve 7" is open so that the supply valve 3" remains closed, the spring 15" biases the piston 13" into its closed condition (shown in solid lines in FIG. 2) so that the closure member 133" seals the control port 4" and the tank closure member 25 seals the drain outlet 24. Conversely when the control valve 7" is closed by a jig carrying slices being placed on the platform 9 causing the first valve 3" to open, the tank closure member 25 moves (into the tank or upwards in FIG. 2) with the piston 13" to open the drain outlet 24 to allow demineralised water to drain from the tank 1. At the same time opening of the supply valve 3" allows fresh demineralised water to be supplied to the spray heads 23 to rinse further the slices carried by the jig.

The end 9" of the platform 9 is connected to the rod 19 to maintain the float 18 in a raised position when the tank is being drained via the drain outlet 24.

FIG. 3 illustrates a modification of the embodiment shown in FIG. 2 in which the supply valve 3" is replaced by two separate supply valves 3"a and 3"b of the same type as the supply valve 3" in FIG. 2 and each controlled by the same control valve 7" via a common second supply line 5". For the purposes of illustration FIG. 3 shows the apparatus in a condition of use with a jig 100 placed on the platform 9 so that the platform 9 is tilted to close the control valve 7".

In this arrangement, the supply valve 3"a is provided for controlling the supply of demineralised water to the spray heads 23 while the supply valve 3"b is provided merely for controlling opening of the drain outlet 24 in response to fluid pressure changes at its control port 4"b and is not connected to a first supply pipe. As will be appreciated from FIG. 3, the three supply valves 3', 3"a and 3"b are all disposed the same way up which requires that the control port 4"b of the supply valve 3"b is disposed at the same end of the supply valve as the connection of its piston 13"b to the connecting rod 27 of the tank closure member 25. Accordingly, the control port 4"b is either offset from the center of the end face 142"b of the first valve 3"b or is disposed in a side wall of the chamber 14"b so as to communicate with the side of the closure member 133"b remote from the spring 15"b.

The use of the apparatus shown in FIG. 2 will now be described.

It is first assumed that a demineralised water supply has been connected to the first supply pipes 2' and 2" and a main valve (not shown) opened to enable water to be supplied to the first supply pipes 2' and 2", and that the tank 1 is initially empty.

As the tank 1 is empty the weight of the float 18 and rod 19 combination acts to close the control valve 7' causing the piston 13' to be moved to its open condition allowing demineralised water to be supplied via the inlet 1' to the tank. When the level of demineralised water in the tank reaches the float 18, the float 18 begins to rise with the liquid level thus moving the end 19b of the rod 19 out of contact with the valve seat 7'b so reducing the fluid pressure at the control port 4' and allowing the biassing force of the spring 15' to return the piston 13' to its closed condition (shown in solid lines in FIG. 2). Thus supply of demineralised water through the inlet 1' is stopped when the liquid level within the tank reaches a predetermined level determined by the position of the float. Opening of the control valve 7' allows a trickle flow of demineralised water to enter the tank via the second supply line 5' and auxilliary inlet 8' to refresh the water within the tank. An overflow pipe (not shown) may be provided within the tank or excess water may merely weir over the edge 1" of the tank 1.

With the tank thus filled, a jig 100 carrying slices is plunged into the tank of water and is placed on the platform 9. The weight of the jig 100 causes the platform to tilt as shown in FIG. 3 so closing the control valve 7" causing the fluid pressure at the control port 4" to increase forcing the piston 13" to move to its open condition (shown in dotted lines in FIG. 2) against the biassing force of the spring 15". As indicated above, the tank closure member 25 moves with the piston 13" so opening the drain outlet 24 and allowing demineralised water to drain from the tank via the drain outlet 24. At the same time the movement of the piston 13" to its open condition allows water to be supplied to the spray heads 23 via the supply line 2" to rinse the semiconductor slices carried by the jig still further.

As discussed above the one end 9" of the platform 9 is connected to the rod 19 to ensure that the float 18 remains in a raised position when the platform 9 pivots under the weight of a jig of slices despite the fact that the level of demineralised water within the tank 1 will drop as water drains out through the open drain outlet 24. It should of course be appreciated that the float 18 and platform 9 are arranged such that this connection does not cause the platform 9 to tilt to close the control valve 7' when the rod 19 is raised by the float 18 beginning to float. Rather the arrangement is such that the platform 9 may be tilted a little the other way (so that the end 9' is lower than the end 9') when the control valve 7' is closed by the weight of the float.

After the slices have been sprayed by the spray heads 23 for a desired period of time, the jig 100 is lifted from the platform allowing the control valve 7" to return to the open condition and causing the control valve 7' to close under the weight of the float 18. The hydraulic accumulator 23a provides a head of pressure which maintains a supply of water to the spray heads 23 for a short while after the jig is lifted off the platform 9 so that rinsing of the slices continues as the jig is lifted out of the tank 1. The closure of the control valve 7' causes the supply valve 3' to open to allow the tank to be refilled ready for the next jig.

The use and operation of the apparatus shown in FIG. 3 are substantially identical to the use of the apparatus shown in FIG. 2, the only difference being that the separate, but commonly controlled, supply valves 3"a and 3"b are used for controlling movement of the tank closure member 25 and supply of water to the spray heads 23, respectively.

It should of course be appreciated that various different combinations of the arrangements described above could be provided. Thus, for example, the float 18 controlled fast fill arrangement shown in FIGS. 2 and 3 only could be provided to control filling of the tank 1. Advantageously, the float controlled fast fill facility could be provided in combination with the platform 9 (but not the supply valve 3"), the one end 9" of the platform 9 being connected to the float rod 19 but the fulcrum or pivot point 9a being positioned as shown in FIG. 1 so that prior to the placing of a jig on the platform 9 the fast fill supply of demineralised water via the first supply line 2 is controlled by the float but placing of a jig carrying slices on the platform 9 overides the action of the float 18 causing the one end 9' of the platform) to tilt downwardly so closing the control valve 7' and opening the first valve 3' to increase the supply of demineralised water to the tank. Thus, in such an arrangement after the tank 1 has been filled to the predetermined level determined by the height of the float 18 above the bottom of the tank, the demineralised water in the tank is kept fresh by the trickle flow through the open control valve 7' via the second supply line 5 when not in use but when a jig carrying slices is placed on the platform 9 the weight of the jig causes the platform to tilt so closing the control valve 7' causing an increase in fluid pressure at the control port 4' which opens the supply valve 3' to supply water to the tank to rinse the slices thoroughly.

Also it would be possible just to provide the float controlled fast fill and the spraying facility by omitting the drain outlet 24 or alternatively just the spraying and the draining facility.

In the arrangement shown in FIG. 2 it would be possible to enable selection of one of the above arrangements by providing manually operable ON/OFF valves (not shown) in the water supply lines 2' and 2" to the supply valves 3' and 3" so that either a fast fill facility or a spraying and draining facility or the combination of the two could be provided. Further possibilities are available in the FIG. 3 arrangement because the provision of manually operable valves in the first water supply lines 2', 2" and supply line 5" would enable any one or any combination of the three facilities, namely the fast fill, draining and spraying facilities, to be selected.

In each of the arrangements described above, the supply valves 3 are controlled by fluid pressure at a control port 4. Such supply valves may be for example valves available commercially from Plade Plastics Design and Fabrications (Glasgow) Ltd, Plade Works, Gladstone Avenue, Barrhead, Glasgow G78 1QT, UK. Where $\frac{3}{4}$ (19.05 mm) such Plade valves are used with a demineralised water supply at a pressure of 30 psi ($207.00 \times 10^3$ Pa) providing a flow of 30 liters per minute, then the flow restricting devices 6 will be designed or selected to provide a minimum flow of 80 milliliters per minute through the associated second supply line. Usually the flow restricting devices 6 will be designed to provide a flow of 150 milliliters per minute.

It will be appreciated that although the supply valves 3 described above are normally closed, that is the biassing force of the springs 15 acts to close the valves 3, normally open valves could be used. It would of course then be necessary to arrange for the control valves 7 to act in the opposite sense to that described above, for example by connecting the float to a bell crank or lever arrangement which allows the control valve 7 to remain open until the float begins to float when a weight attached to the bell crank or lever arrangement acts to close the valve and by mounting the platform 9 so that it normally closes the control valve, the weight of a jig carrying slices acting to tilt the platform 9 to open the control valve 7.

In a modification of the arrangements described above, the supply valves may be replaced by alternative valves which are not operable by a control valve which acts to control fluid pressure at a control port but are merely operable by movement of a weight acting on a movable member to open or close the supply valve. Thus, for example such a supply valve may comprise a chamber within which a valve member is pivotally mounted so as normally to close (or open) a passage through the valve, the supply valve member being directly connected to a movable member disposed outside the valve chamber so that, when a weight acts on the movable member, the valve member is moved to open (or close) the valve. An example of such a first valve is the modified TORBECK (Registered Trade Mark) equilibrium float valve MKII(F) available from Torbeck Control valves Ltd, of 7 Tewin Court, Welwyn Garden City, Hertfordshire, England.

FIG. 4 illustrates a modified embodiment of apparatus in accordance with the invention wherein the supply valves shown FIGS. 1 to 3 are replaced by supply valves directly operable by a movable external member, such as the modified Torbeck valves mentioned above.

As will be appreciated the arrangement shown in FIG. 4 is somewhat similar to that shown in FIG. 2. Thus a modified supply valve 30' providing a fast fill facility replaces the supply valve 3' and the end 19b of the rod 19 extends (through an appropriate liquid tight seal) out of the bottom of the tank to rest on a movable member 31' of the supply valve 30', the weight of the rod 19 and float 20 depressing the movable member 31' to move the valve member of the supply valve 30' from its normally closed position to open the valve 30' to enable the tank 1 to be filled via the inlet 1'. Again as in the arrangement described with reference to FIG. 2, when the liquid level within the tank reaches the float 18 causing the float to rise with the liquid level, the rod 19 is lifted allowing the valve member to return to its closed condition preventing supply of liquid via the supply valve 30'.

The arrangement shown in FIG. 4 has a spraying facility which works in a similar manner to the corresponding facility of the FIG. 2 arrangement. Thus, when a jig of slices is placed on the platform 9, the platform 9 tilts about the fulcrum 9a lowering the end 9" of the platform and so lowering a rod or movable member 33 mounted to the underside of the platform. The rod 33 extends (through an appropriate liquid tight seal) through the bottom of the tank and is arranged to depress a movable member 31" of a second supply valve 30", so opening the supply valve 30" and allowing water to be supplied to the spray heads 23.

The dump or draining facility differs from that shown in FIG. 2. Thus, in the FIG. 4 arrangement, the tank closure member 25 is held in place sealing the drainage outlet 24 by an expansible bellows 34, the bellows 34 being expanded to hold the closure member 25 in a position closing the outlet 24 by the pressure of the demineralised water supplied to the bellows via a bypass supply line 35 communicating with liquid supply line 2" connected to the supply valve 30" when the valve 30" is closed. A flow restricting device 6' is provided within the line 2". Opening of the supply valve 30" by the placing of a jig carrying slices on the platform 9 reduces the liquid pressure within the bellows 34 causing them to collapse to open the drain outlet 24. As in the arrangement shown in FIG. 2, the end 9" of the platform 9 is connected to the float rod 19 so as to maintain the float in a raised position to keep the supply valve 30' open when the tank 1 is drained as described above.

The supply valves 30' and 30" may have a small aperture of, for example, 1.5 mm diameter drilled in their valve members so as to allow a trickle flow through the supply valves when the supply valves are closed to enable, particularly in the case of the fast fill facility, the demineralised water in the tank to be kept fresh. Alternatively, a small hole may be drilled in the bottom of the tank to give a 150 milliliters per minute draining flow so that the float controlled valve 30' will then supply this on demand.

In use of the apparatus shown in FIG. 4, assuming that the tank 1 is initially empty and that a main supply valve (not shown) has been opened to enable supply of demineralised water to the first supply pipes 2', 2", the weight of the float and rod combination 18 and 19 will act to cause the end 19b of the rod to depress the movable member 31' of the supply valve 30' to open the valve 30' to allow the tank 1 to be filled via the inlet 1'.

When the level of liquid within the tank reaches the float 18, the float will begin to rise with the liquid, raising the rod 19 and so allowing the movable member 31' to return the valve member to its normally closed condition. A small aperture may be provided in the valve member to allow a trickle flow of demineralised water into the tank 1 to keep the water fresh, excess water either weiring over the top edge of the tank 1 or leaving the tank 1 via a constant head or overflow pipe such as the pipe 17 shown in FIG. 1.

When the tank 1 has been filled, a jig carrying semiconductor slices is placed on the platform 9 causing the platform 9 to tilt so that the end 9' moves downwardly causing the rod 33 to depress the movable member 31" so opening the supply valve 30" allowing demineralised water to be supplied to the spray heads 23 to rinse the semiconductor slices and at the same time reducing the fluid pressure within the bellows 34 so allowing the tank closure member 25 to move to allow demineralised water to drain from the tank 1. After the semiconductor slices have been rinsed by the spray heads for a desired time, say 30 seconds, the jig is lifted out of the tank 1 causing the platform 9 to return to its original position enabling the movable member 31" to return to its normally closed condition. Closure of the supply valve 30" causes the fluid pressure within the bellows 34 to increase, expanding the bellows and so returning the tank closure member 25 to its closed condition. During draining of the tank 1, the float 18 has been maintained in a raised condition due to the connection of the one end 9" of the platform to the rod 19, however when the jig is removed from the platform 9 the weight of the float and rod 18 and 19 combination acts to depress the movable member 31' to open the supply valve 30' so allowing the tank to be refilled.

If desired, a hydraulic accumulator 23a (see FIG. 2) may be provided in the first supply line 2" to the spray heads 23 so as to maintain a demineralised water supply to the spray heads for a predetermined period after the supply valve 31" is reclosed so that rinsing of the semiconductor slices continues as the jig is lifted from the tank.

It should of course be appreciated that more than one rinsing or washing operation may be required to remove residual etchant acid or alkali, from semiconductor slices. Thus the jig carrying the semiconductor slices will normally first be immersed into a demineralised water bath to quench operation of residual etchant, then the jig carrying the slices will be transferred to one or more further rinsing or washing baths until, in a final washing bath, the jig is rinsed with demineralised water until the resistivity of the water reaches a required value, for example 5 Megaohms.

As an example, a system for washing or rinsing semiconductor slices may have one or more first quenching or washing tanks followed by a second tank provided with spraying and draining facilities (as shown in FIG. 2), plus possibly also a fast fill facility, and then a final rinse tank.

FIG. 5 illustrates schematically one possible system. As shown in FIG. 5, a first washing or quenching tank 1a is provided which may be positioned so as to be capable of receiving up to, for example, four jigs carrying silicon slices. The first tank 1a is followed by apparatus 41 in accordance with the invention having a second tank 1b providing spraying and draining facilities, for example the apparatus shown in FIG. 2 or FIG. 4 with or without the float controlled fast fill facility. Finally a final rinse apparatus 42 of the type shown in FIG. 1 is provided having a tank 1c the operation of which is triggered by the placing of a jig on the platform 9 as in the arrangement shown in FIG. 1. Initial filling of each of the tanks 1a, 1b and 1c may be via a float controlled supply valve as in FIG. 2 or FIG. 4. As shown in FIG. 5, however, initial filling of the spraying and draining tank 1b and the final rinse tank 1c may be via a float controlled supply valve while the first rinsing or quenching tank 1a may be supplied with the waste water from the final tank 1c via a trough 43 surrounding the tank 1c collect water weiring over the top edge of the tank 1c and to supply that water via a waste pipe 44 to the initial quenching tank 1a. In order to enable filling of the first tank 1a with waste water from the final tank 1c, the desired water level in the first tank 1a needs to be lower than the lip of the trough 43. This may be arranged as shown by mounting the tank 1c and surrounding trough at a higher level than the tank 1a or by arranging the trough 43 to be nearer the top of the tank 1c. The tank 1a may contain a platform 9 for supporting the jigs. The platform 9 may be apertured so as to act as a diffusing plate to facilitate mixing in of the incoming waste water from the tank 1c.

Operation of the apparatus shown in FIG. 5 is as follows. Initially a jig carrying semiconductor slices is immersed in the initial or quenching tank 1a which is filled with demineralised water to dilute and so quench residual etchant on the slices. Where the tank 1a is partitioned (see FIG. 7) the jig may be plunged into each tank section in sequence. The jig is then transferred to the spraying and draining tank 1b which, assuming the arrangement shown in FIGS. 2 or 4 is provided, is initially full of water. The weight of the jig on the platform 9 opens the supply valve 3" causing the tank closure member 25 to move to allow water to drain from the tank 1b and at the same time to supply water to the spray heads 23. Water draining from the tank 1b may be supplied via a waste pipe to refresh the water in the initial quenching tank 1a because, as will be appreciated, the waste water from the second tank 1b will be significantly less contaminated with etchant than the water in the tanks 1a which the jig was initially placed, however it is preferred that the waste or drain water from the final rinsing tank 1c be used as it will be cleaner. The spray heads 23 thus direct water onto the slices to rinse off residual etchant. After a desired period of spraying, the jig is lifted off the platform 9 so causing the valves 3' and 3" to close allowing the tank to refill. If the hydraulic accumulator 23a is provided, spraying continues for a while after the jig has been lifted off the platform 9.

The jig is then transferred to the final rinsing tank 1c. The weight of the jig on the platform 9 within the final rinsing tank 1c opens the first valve 3' causing a high flow of water to be supplied to the tank 1c. The jig is left in the tank 1c until the resistivity of the water within the tank 1c, as measured by an appropriate conductivity meter, reaches a predetermined value, for example 5 Megaohms, at which the slices are considered to be sufficiently clean of etchant. As discussed above, the water weiring over the top edge of the final tank 1c may be supplied via a waste pipe 44 to the initial quenching tank 1a as the waste water from the final rinsing tank 1c will be sufficiently pure for providing an effective first quenching step.

FIGS. 6 and 7 illustrate a further, alternative, system for washing or rinsing semiconductor slices having a combination of different rinsing tanks. Although as shown the arrangement in FIGS. 6 and 7 employs supply valves of the type shown in FIG. 4, for example Torbeck valves, it will of course be appreciated that supply valves of the type shown in FIGS. 1 to 3 in combination with control valves may be used.

As shown most clearly in FIG. 7, the system comprises first or initial rinsing apparatus 50 having three rinsing tanks 1d, spraying and raining apparatus 51 using a tank 1e and a final rinsing apparatus 52 having a tank 1f. The spraying and draining apparatus 51 may be similar to that shown in FIG. 4 with the exception that, as discussed below, the spraying and draining apparatus 51 has a manually operable tank closure member 25. The final rinsing apparatus incorporates a jig triggered arrangement similar to that shown in FIG. 1 but using the FIG. 4 arrangement in which tilting of the platform 9 or the direct weight of the jig acts to move a movable rod 33f which acts directly on a movable member 31f of the supply valve 30f.

As shown in FIGS. 6 and 7, fast filling of the initial rinsing or quenching apparatus 50 and the spraying and draining apparatus 51 is controlled by a float controlled valve system disposed in a float chamber 21e communicating with the tank 1e so that supply of liquid to the tanks 1d is controlled by the liquid level in the tank 1e. As illustrated in FIG. 7, the float chamber 21e contains three separate supply valves 30d, 30'and 30"e each of the type described above in relation to FIG. 4 and each controlled by a respective float 18d, 18'e and 18"e and rod 19d, 19'e and 19"e combination in the same manner as the float 18 and rod 19 combination acts to control the valve 30' in the FIG. 4 arrangement.

Demineralised water is supplied to the initial quenching tanks 1d and the spraying and rinsing tank 1e via a first main supply line 61 which branches to form three first supply lines 2d, 2e' and 2e" each controlled via a respective one of the first valves 30d, 30'e and 30"e. The first supply line 2d controlled by the supply valve 30d is arranged to supply demineralised water to each of the three quenching tanks 1d, while the first supply line 2e' controlled by the supply valve 30'e is arranged to supply demineralised water to fill the spraying and draining tank 1e and the first supply line 2"e controlled by the supply valve 30"e is arranged to supply demineralised water to spray heads 23 of the tank 1e. The final rinsing tank 1f is supplied with demineralised water through a first supply line 2f, the supply being controlled via a further supply valve 30f operable by a movable member 33f extending into the tank via an appropriate liquid tight seal and movable under the weight of a jig placed in the tank to open the valve 30f to supply demineralised water to the tank.

Although the spray and draining tank 1e may be provided with a jig-triggered platform 9 as in the arrangement shown in FIG. 4, in the arrangement illustrated in FIGS. 6 and 7, the tank closure member (not shown) is manually operated by means of a plunger 65 connected to one end of the tank closure member, the other end being pivotally mounted to the bottom of the tank. As discussed below supply of processing liquid to the spray heads 23 is controlled by a float controlled valve 30"e so that opening of the outlet 24 by the tank closure member 25 causes the float 18e" to be lowered to close the valve 30"e to enable supply of liquid to the spray heads 23. With such an arrangement, for the sake of convenience, the plunger 65 and tank closure member 25 are disposed in the float chamber 21e.

It will of course be appreciated that each of the three supply valves 30d, 30'e and 30"e and their floats 18d, 18e' and 18"e could be disposed in a respective float chamber associated with the respective tank 1d, 1e to be controlled by the supply valve. Also, it may be possible for a single supply valve 30 to be used to control water supply to each of the tanks 1d and 1e and to the spray heads 23 although the provision of three separate supply valves enables, if desired, the water levels in the different tanks to be controlled to have different maximum levels.

In operation of the apparatus shown in FIGS. 6 and 7, assuming the tanks 1d, 1e and 1f are initially empty, the weight of the floats 18d, 18e and 18"e acting on the respective supply valves 30d, 30'e and 30"e opens the supply valves 30d, 30'e and 30"e to supply demineralised water to the tanks 1d and 1e. The final rinsing tank 1f may initially be filled with water by depressing the movable member 33f for a desired time using, for example, a clean jig. Once the level of the water in the tanks 1d and 1e reaches the predetermined height the floats 18d, 18e' and 18"e begin to rise with the liquid level thus closing the supply valves 30d, 30'e and 30"e. As indicated above the valve members of the supply values 30d, 30'e and 30"e may each be formed with a small aperture to enable a trickle flow of liquid into the tanks 1d and 1e when the supply valves 30d, 30'e and 30"e are closed.

A jig carrying semiconductor slices to be washed or rinsed is first plunged into each of first rinsing or quenching tanks 1d in sequence to dilute and at least partially remove any residual etchant acid and prevent further etching action.

The jig is then transferred to the spraying and rinsing tank 1e. Depression of the plunger 65 opens the tank closure door (not shown) causing the demineralised water to drain from the tank 1e. As the demineralised water drains from the tank 1e the floats 18d, 18e' and 18"e fall eventually causing the supply valves 30d, 30'e and 30"e to open supplying water to the spray heads 23 to spray the jig within the tank 1e and also supplying demineralised water to the initial washing tanks 1d to freshen the water for the next jig, excess water weiring over the tops of the tanks 1d. After the jig has been sprayed for a predetermined period of time, it is lifted from the tank 1e and transferred to the jig-triggered final rinsing tank 1f. The weight of the jig depresses the movable member 33f so opening the first valve 30f to enable a fast flow of demineralised water into the tank 1f.

After a short period allowed to enable the spray heads 23 to rinse out the tank 1e, the plunger 65 is raised and the tank 1e is thus allowed to refill for the next operation. The jig is kept in the tank 1f until a conductivity meter 54 registers a desired resistivity for the water, for example 5 Megaohms.

Comparison tests have been carried out using (1) a conventional semiconductor slice rinsing system and using (2) apparatus in accordance with the invention. Using the conventional system 1, a jig was transferred from an acid etchant bath to a rinsing bath or tank to which demineralised water was being supplied at a fast flow rate, typically 8 liters per minute, excess or waste water merely weiring over the top of the tank. Using (2) apparatus in accordance with the invention and similar to that shown in FIG. 5 or FIGS. 6 and 7, a semiconductor slice carrying jig was transferred from the acid etchant bath to, in sequence, each of three initial rinsing or quenching tanks, then to a spraying and draining tank where the jig was sprayed for 30 seconds after opening of the tank drain outlet and finally to a jig-triggered final rinsing bath. In each case two semiconductor slice carrying jigs were rinsed, one clean jig and one dirty jig. The dirty jigs were contaminated by repeating the following steps in sequence three times to cause acid etchant to be adsorbed by the plastics material of the jig. Thus, a clean jig was placed in an oven, removed from the oven and immersed in acid etchant, plunged into a demineralised water bath or tank and finally sprayed and rinsed with demineralised water for 30 seconds.

As an example, the results of one set of such tests showed that using the conventional method the clean jig needed to be rinsed in the fast flow bath for at least approximately 8 minutes and the dirty jig for at least 25 minutes for the demineralised water in the tank 1f to reach a resistivity of 5 Megaohms. In comparison using apparatus in accordance with the invention the clean jig needed to be rinsed in the final rinsing bath for approximately 1 minute (7 minutes less) while the dirty jig needed to be rinsed for approximately 8 minutes (16 minutes less) for the demineralised water to reach the same resistivity of 5 Megaohms. Thus, the overall time required for the rinsing process may be considerably shortened by using apparatus in accordance with the invention, particularly where a dirty or contaminated jig is being used to carry the slices to be washed. Also because of the decrease in the rinsing time and the use of apparatus where the fast flow of demineralised water is automatically controlled as described above, the amount of demineralised water used can be considerably reduced.

Where a platform 9 is provided for supporting a jig carrying semiconductor slices, the platform 9 normally has a rectangular top surface 9b and depending side walls 9c (FIG. 1) so as to form a downwardly open tray like structure. The platform 9 may be formed with a predetermined pattern of apertures (not shown) over at least the top surface 9b to assist in ensuring mixing of water supplied to the tank via the inlet 1'. Also, where the jig for carrying silicon slices is of an apertured type which enables the slices to be raised upwardly from underneath the jig, the platform 9 may be provided with projections (not shown) appropriately spaced on the top surface 9b so as to raise and support the slices slightly out of their supports in the jig to ensure still further that the slices are cleaned thoroughly.

It should of course be appreciated that the apparatus can be used for purposes other than washing semiconductor slices, for example it may be used in any other method where objects are to be washed or processed by contact with a liquid, particularly where the washing or processing liquid used (which need not necessarily, of course, be water) is expensive and where a high degree of cleanliness or freedom from contamination is required for the rinsed or washed object.

From reading the present disclosure, other modifications will be apparent to persons skilled in the art. Such modifications may involve other features which are already known in the design and use of apparatus suitable for processing semiconductor slices and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explictly or implicitly or any generalisation or modification of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An apparatus for processing semiconductor slices comprising
    (a) jig means for carrying semiconductor slices,
    (b) tank means for receiving said jig means,
    (c) first supply line means for supplying processing liquid to said tank means,
    (d) at least one supply valve means for controlling supply of said processing liquid through said first supply line means, said supply valve means operating in response to changes in fluid pressure at a control port of said supply valve means,
    (e) second supply line means for supplying said processing liquid to said control port to control operation of said supply valve means, and
    (f) at least one control valve means for controlling said fluid pressure at said control port, said control valve means communicating said second supply line means with an inlet to said tank means, and said control valve means operating in response to changes within said tank means.

2. An apparatus according to claim 1, wherein said second supply line means communicates with said first supply line means by a flow restricting device, said flow restricting device passing a low volume flow of said processing liquid into said tank means upon opening said at least one control valve means.

3. An apparatus according to claim 1, wherein said at least one supply valve means includes movable piston means for sealing said control port, said movable piston means sealing said control port upon said supply valve means being one of open or closed, and wherein biasing means are disposed for moving said movable piston means to the other of the closed or open positions of said supply valve means in response to an increase in said fluid pressure at said control port, said increase being caused by closing of an associated one of said at least one control valve means.

4. An apparatus according to claim 1, wherein aid at least one control valve means is a needle valve.

5. An apparatus according to claim 1, wherein said at least one supply valve means includes a closure member, said closure member sealing an outlet of said tank means upon said supply valve means being in a first position, and said closure member opening said outlet of said tank means upon said supply valve means being in a second position in order to permit liquid to drain through said outlet.

6. An apparatus according to claim 1 or claim 2 or claim 3 or claim 4 or claim 5, further comprising another first supply line means for supplying processing liquid to said tank means, another supply valve means for controlling flow of said processing liquid through said another first supply line means, and another second supply line means for communicating with a further control valve and with a control port of said another supply valve means, wherein said further control valve is operable in response to changes in liquid level within said tank means.

7. An apparatus according to claim 6, wherein said further control valve includes a float connected to a movable member, said float moving said movable member upon a liquid level in said tank means exceeding a predetermined height above a bottom of said tank means.

8. An apparatus according to claim 7, wherein said movable member includes a rod depending from said float, said rod being slidably mounted to one of a wall of said tank means or a float chamber communicating with said tank means, wherein said rod has a lower end cooperating with an outlet of said another second supply line means to define said further control valve, and wherein said rod supports said float at said predetermined height above said bottom of said tank means, said lower end of said rod engaging said outlet of said another second supply line means to close said further control valve until a liquid level in said tank means rises sufficiently to cause said float to lift said lower end of said rod out of engagement with said outlet of said another second supply line means.

9. An apparatus according to claim 7, wherein means are disposed in said tank means for maintaining said float in a raised position upon disposing said jib means into said tank means in order to prevent opening of said another supply valve means.

10. An apparatus according to claim 1 or claim 2 or claim 3 or claim 4 or claim 5, wherein said at least one control valve means operates in response to changes in liquid level within said tank means.

11. An apparatus according to claim 10, wherein said control valve means includes a float connected to a movable member, said float moving said movable member upon a liquid level in said tank means exceeding a predetermined height above a bottom of said tank means.

12. An apparatus according to claim 11, wherein said movable member includes a rod depending from said float, said rod being slidably mounted to one of a wall of said tank means or a float chamber communicating with said tank means, wherein said rod has a lower end cooperating with an outlet of said second supply line means to define said control valve means, and wherein said rod supports said float at said predetermined height above said bottom of said tank means, said lower end of said rod engaging said outlet of said second supply line means to close said control valve until a liquid level in said tank means rises sufficiently to cause said float to lift said lower end of said rod out of engagement with said outlet of said second supply line means.

13. An apparatus according to claim 11, wherein means are disposed in said tank means for maintaining said float in a raised position upon disposing said jig means into said tank means in order to prevent opening of said supply valve means.

14. An apparatus according to claim 1 or claim 2 or claim 3 or claim 4 or claim 5, wherein said control valve means is disposed to open said supply valve means in response to a weight within said tank means.

15. An apparatus according to claim 14, wherein said tank means includes platform means for supporting said jig means, said platform means being mounted within said tank means, and said platform means being movable under weight of said jig means to operate said control valve means to open said supply valve means.

16. An apparatus according to claim 15, wherein said platform means carries one of a valve member and a valve seat of said control valve means, and wherein another of said valve member and said valve seat include said inlet of said tank means communicating with said second supply line means.

17. An apparatus according to claim 1 or claim 2 or claim 3 of claim 4 or claim 5, wherein said at least one supply valve means includes a first and second supply valve, said second supply valve controlling liquid supply by said first supply line means, wherein said second supply line means communicates with the control port of said second supply valve to control said second supply valve, wherein said second supply valve is controlled by said at least one control valve means to open one of said first and second supply valves while closing the other of said first and second supply valves, and wherein said second supply valve includes a closure member, said closure member closing an outlet of said tank means when said second supply valve is closed, said closure member opening said outlet of said tank means when said second supply valve is open to drain liquid from said tank means through said outlet.

18. An apparatus for processing semiconductor slices comprising
(a) jig means for carrying semiconductor slices,
(b) tank means for receiving said jig means,
(c) first supply line means for supplying processing liquid to said tank means,
(d) at least one supply valve means for controlling supply of said processing liquid through said first supply line means, and
(e) platform means for supporting said jig means in said tank means, said platform means being movably mounted within said tank means under weight of said jig means carrying semiconductor slices in order to one of open or close said supply valve means,
wherein a second supply line means is provided for supplying said processing liquid to said tank means, and wherein a second supply valve means is provided for controlling flow of said processing liquid through said second supply line means, said second supply valve means being operated in response to liquid level changes in said tank means.

19. An apparatus according to claim 18, wherein said second supply valve means is controlled by a float, said float being carried by a rod, said rod being slidably mounted to one of a wall of said tank means or a float chamber communicating with said tank means, wherein said rod supports said float at a predetermined height above a bottom of said tank means, and wherein said rod has a lower end cooperating with a movable member of said second supply valve means, said second supply valve means being maintained in an open condition until the liquid level in said tank means exceeds said predetermined height, said float rising to lift said lower end of said rod out of engagement with said movable member in order to close said second supply valve means.

20. An apparatus according to claim 18 or claim 19, wherein an expansible member maintains a closure member in a first position to close an outlet of said tank means, said expansible member being controlled by said supply valve means to expand and contract, and wherein upon opening said supply valve means, said expansible member contracts to permit liquid to drain through said outlet from said tank means, and upon closing said supply valve means, said expansible member expands to seal said outlet.

21. An apparatus for processing semiconductor slices comprising
(a) jig means for carrying semiconductor slices,
(b) tank means for receiving said jig means,
(c) first supply line means for supplying processing liquid to said tank means,
(d) at least one supply valve means for controlling supply of said processing liquid through said first supply line means, and
(e) platform means for supporting said jig means in said tank means, said platform means being movably mounted within said tank means under weight of said jig means carrying semiconductor slices in order to one of open or close said supply valve means,
wherein said supply line means communicates by said supply valve means with at least one spray head disposed for spraying said processing liquid downwardly into said tank means, and
wherein a hydraulic accumulator is disposed to supply said processing liquid to said spray head, said supply of processing liquid being maintained for a period after said supply valve means is closed.

22. An apparatus for processing semiconductor slices comprising
(a) jig means for carrying semiconductor slices,
(b) tank means for receiving said jig means,
(c) first supply line means for supplying processing liquid to said tank means,
(d) at least one supply valve means for controlling supply of said processing liquid through said first supply line means, and (e) platform means for supporting said jig means in said tank means, said platform means being movably mounted within said tank means under weight of said jig means carrying semiconductor slices in order to one of open or close said supply valve means, wherein an expansible member maintains a closure member in a first position to close an outlet of said tank means, said expansible member being controlled by said supply valve means to expand and contract, and wherein upon opening said supply valve means, said expansible member contracts to permit liquid to drain through said outlet from said tank means, and upon closing said supply valve means, said expansible member expands to seal said outlet.

* * * * *